(12) United States Patent  
Chang

(10) Patent No.: US 8,658,333 B2  
(45) Date of Patent: Feb. 25, 2014

(54) REFLECTIVE MASK

(75) Inventor: Chai Ming Chang, New Taipei (TW)

(73) Assignee: Nanya Technology Corporation, Tao-Yuan Hsien (TW)

( * ) Notice: Subject to any disclaimer, the term of this patent is extended or adjusted under 35 U.S.C. 154(b) by 68 days.

(21) Appl. No.: 13/487,937

(22) Filed: Jun. 4, 2012

(65) Prior Publication Data

US 2013/0323626 A1 Dec. 5, 2013

(51) Int. Cl.  
*G03F 1/00* (2012.01)

(52) U.S. Cl.  
USPC .............................................................. 430/5

(58) Field of Classification Search  
USPC ................................................ 430/5; 378/35  
See application file for complete search history.

(56) References Cited

U.S. PATENT DOCUMENTS 5,272,744 A * 12/1993 Itou et al. ......................... 378/35  
6,986,971 B2 * 1/2006 Han et al. ........................... 430/5  
7,300,724 B2 * 11/2007 Yan .................................... 430/5  
7,947,415 B2 * 5/2011 Amano et al. .................... 430/5

* cited by examiner

*Primary Examiner* — Stewart Fraser  
(74) *Attorney, Agent, or Firm* — Stites & Harbison PLLC; Juan Carlos A. Marquez, Esq.

(57) ABSTRACT

A reflective mask includes a substrate, a first reflective multi-layer, a second reflective multi-layer, a first patterned absorber layer and a second patterned absorber layer. The substrate includes a first surface and a second surface opposite to the first surface. The first reflective multi-layer is formed on the first surface of the substrate. The second reflective multi-layer is formed on the second surface of the substrate. The first patterned absorber layer is formed on the first reflective multi-layer. The second patterned absorber layer is formed on the second reflective multi-layer.

19 Claims, 3 Drawing Sheets

US 8,658,333 B2

REFLECTIVE MASK

BACKGROUND OF THE INVENTION

1. Technical Field

The present invention relates to a lithography mask or reticle, and more particularly relates to a reflective mask or reticle.

2. Background

Advancements in photolithography technology allow semiconductor integrated circuits to be produced in smaller and smaller sizes and with better and better performance. Deep ultra-violet (DUV) light with a wavelength of 248, 193, or 157 nanometers has recently been applied to chip manufacturing. Several candidate methods, based on extreme ultra-violet (EUV) light, x-rays, electrons, and ion beams, are competing to emerge as the next generation of lithography techniques.

EUV lithography (EUVL) is probably the most promising candidate and uses EUV light with a wavelength of about 10 to 15 nanometers. EUVL uses reflective rather than refractive optics for wafer exposure owing to a lack of availability of EUV transparent materials. EUV light may be generated using discharge-produced plasma (DPP), and the generated EUV light may be directed by a series of Bragg mirrors to a reflective mask used to pattern a photoresist on a wafer. The entire exposure process is conducted in vacuum conditions to prevent the absorption of the UV light by the air.

To date, developing a suitable quality EUVL mask is the top challenge in EUVL technology. EUVL mask technologies consist of EUVL blank mask preparation and mask fabrication from raw stock. Blank mask preparation requires a flat and defect-free substrate with an extremely low coefficient of thermal expansion and a defect-free multi-layer with accurate thickness and chemical composition. Stringent EUV mask specifications are difficult to meet and result in significantly high EUV mask cost.

SUMMARY

According to one embodiment of the present invention, a reflective mask comprises a substrate comprising a first surface and a second surface opposite to the first surface, a first reflective multi-layer formed on the first surface, a second reflective multi-layer formed on the second surface, a first patterned absorber layer formed on the first reflective multi-layer, and a second patterned absorber layer formed on the second reflective multi-layer.

According to one embodiment of the present invention, a mask blank comprises a substrate comprising a first surface and a second surface opposite to the first surface, a first reflective multi-layer formed on the first surface, a second reflective multi-layer formed on the second surface, a first capping layer formed on the first reflective multi-layer, a second capping layer formed on the second reflective multi-layer, a first absorber layer formed on the first reflective multi-layer, and a second absorber layer formed on the second reflective multi-layer.

The foregoing has outlined rather broadly the features and technical advantages of the present invention in order that the detailed description of the invention that follows may be better understood. Additional features and advantages of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention are illustrated with the following description and upon reference to the accompanying drawings in which.

DETAILED DESCRIPTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

Embodiments are related to a reflective mask, preferably but not exclusively, used for Extreme Ultraviolet Lithography.

Figure 1:
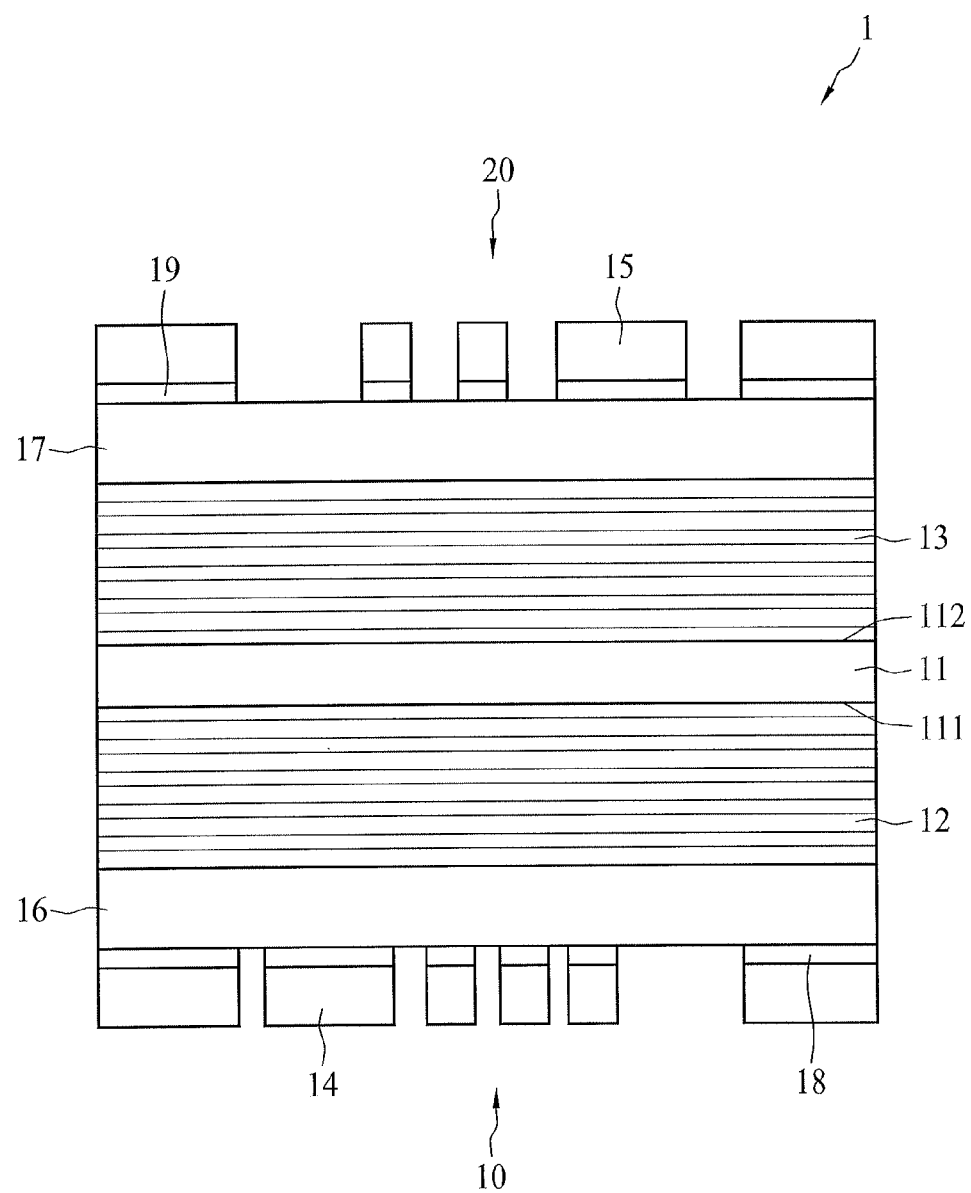
FIG. 1 schematically illustrates a reflective mask according to one embodiment of the present invention.

FIG. 1 schematically illustrates a reflective mask 1 according to one embodiment of the present invention. As shown in FIG. 1, the reflective mask 1 may operate on the principle of a distributed Bragg reflector. The reflective mask 1 may have two pattern regions 10 and 20 disposed on the opposite sides of the reflective mask 1. The reflective mask 1 may comprise a substrate 11 having a first surface 111 and a second surface 112, a first reflective multi-layer 12 immediately formed on the first surface 111, a second reflective multi-layer 13 immediately formed on the second surface 112, a first patterned absorber layer 14 formed on the first reflective multi-layer 12, and a second patterned absorber layer 15 formed on the second reflective multi-layer 13.

The substrate 11 may be a highly polished bare slab. In some embodiments, the substrate 11 comprises EUV opaque glass-like material. In some embodiments, the substrate 11 comprises fused silica. In some embodiments, the substrate 11 comprises Ti and Sn-doped fused silica.

Each of the first reflective multi-layer 12 and the second reflective multi-layer 13 is configured for constructive interference between scattered light from its layers so as to reflect EUV light of a desired wavelength. Selection of appropriate materials and thicknesses for the first reflective multi-layer 12 and the second reflective multi-layer 13 allows the reflected light to combine in phase. Each of the first reflective multi-layer 12 and the second reflective multi-layer 13 may comprise alternating layers of two materials regarded as a layer pair. The two materials may have different refractive indices. One of the two materials may have an atomic number higher than that of another. In order to achieve a resonant reflectivity, the period of the first or second reflective multi-layer 12 or 13 should be approximately half of the wavelength of light to be reflected.

In some embodiments of the present invention, each of the first reflective multi-layer 12 and the second reflective multi-layer 13 may comprise molybdenum (Mo) and silicon (Si).

The layer pair may be formed from, for example, about 2.8 nanometer thickness of Mo and about 4.1 nanometer thickness of Si. Each of the first reflective multi-layer 12 and the second reflective multi-layer 13 may comprise a suitable number of layer pairs to fulfill its requirements. The first reflective multi-layer 12 may have a layer pair number different from that of the second reflective multi-layer 13. Alternatively, in some embodiments, each of the first reflective multi-layer 12 and the second reflective multi-layer 13 may comprise alternating layers of Molybdenum and Beryllium.

The first patterned absorber layer 14 and the second patterned absorber layer 15 may be formed by materials that can absorb light to be reflected. Various metals and alloys are suitable for forming the first patterned absorber layer 14 or the second patterned absorber layer 15. In some embodiments, the first patterned absorber layer 14 or the second patterned absorber layer 15 may comprise metal, alloy, or a tantalum-based material. In some embodiments, the first patterned absorber layer 14 or the second patterned absorber layer 15 may comprise aluminum (Al), aluminum-copper (AlCu), chromium (Cr), tantalum (Ta), or tungsten (W). In some embodiments, the first patterned absorber layer 14 or the second patterned absorber layer 15 may comprise Nickel Silicide (NiSi), Tantalum Boride (TaB), Tantalum Nitride (TaN), Tantalum Silicide (TaSi), Tantalum Silicon Nitride (TaSiN), or Titanium Nitride (TiN).

In some embodiments of the present invention, the first patterned absorber layer 14 and the second patterned absorber layer 15 are configured to have the same circuit pattern. Such an arrangement extends the life span of a reflective mask in comparison to a conventional reflective mask having only one patterned side that has to be discarded if the patterned side is damaged.

In some embodiments of the present invention, the first patterned absorber layer 14 and the second patterned absorber layer 15 may be configured to have different patterns so that two masks are not needed to carry respectively the first patterned absorber layer 14 and the second patterned absorber layer 15. Consequently, mask and mask management cost can be significantly reduced.

Referring to FIG. 1, in some embodiments, the reflective mask 1 may further comprise a first capping layer 16 and a second capping layer 17. The first capping layer 16 and the second capping layer 17 are configured to respectively protect the first reflective multi-layer 12 and the second reflective multi-layer 13 from being affected or changed, such as oxidized, by exposure to the environment. In the present embodiment, the first capping layer 16 is formed between the first patterned absorber layer 14 and the first reflective multi-layer 12, and the second capping layer 17 is formed between the second patterned absorber layer 15 and the second reflective multi-layer 13. The first capping layer 16 or the second capping layer 17 may be formed from a suitable material, such as carbon (C), silicon carbide (SiC), silicon (Si), Ruthenium (Ru), and silicon nitride ($Si_3N_4$).

As shown in FIG. 1, in some embodiments, the reflective mask 1 may further comprise a first buffer layer 18 and a second buffer layer 19. The buffer layer 18 or 19 is a thin layer for protection of the capping layer 16 or 17 and the reflective multilayer 12 or 13 during mask fabrication steps such as cleaning, inspection, and pattern repair. The buffer layer 18 or 19 may be formed from silicon dioxide. Other materials with similar properties may be selected for the buffer layer 18 or 19, such as silicon oxynitride ($SiO_xN_y$).

Figure 2:
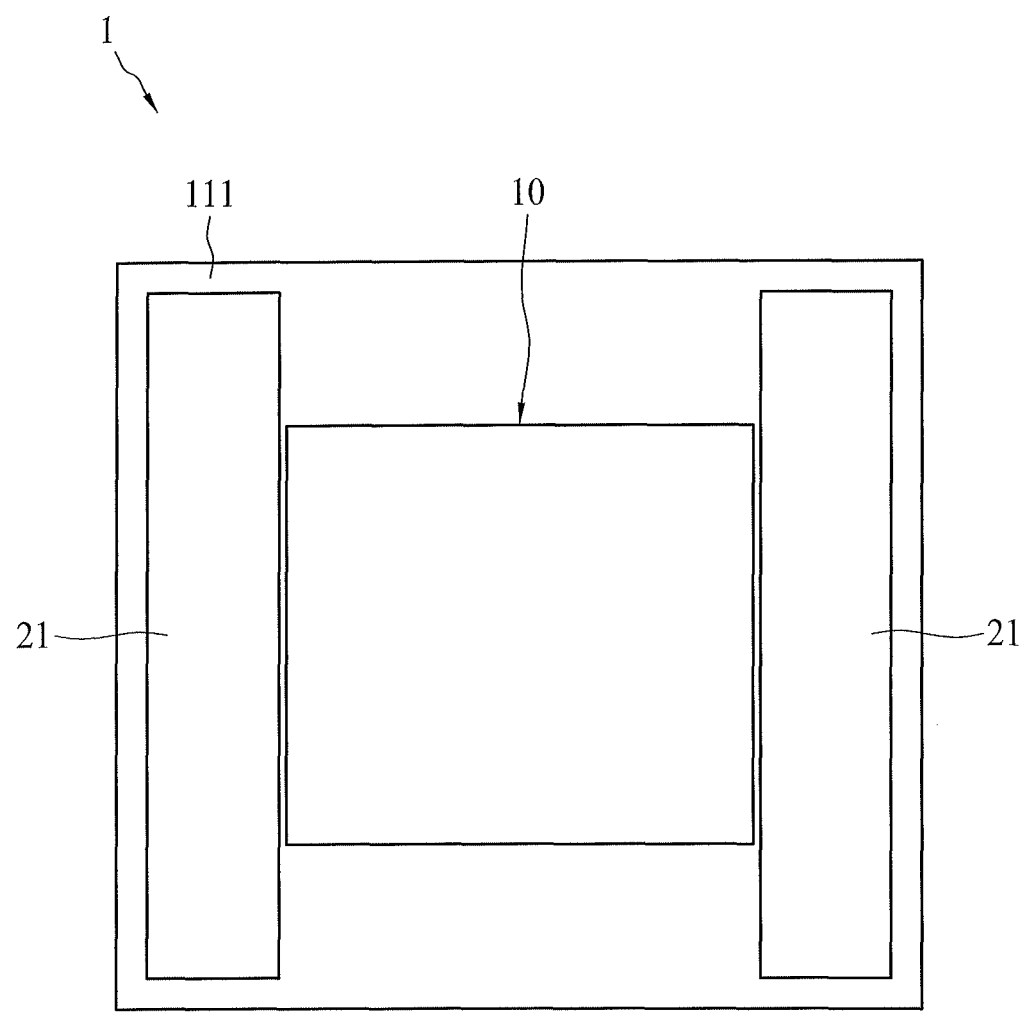
FIG. 2 schematically illustrates a conductive layer of a reflective mask according to one embodiment of the present invention.

FIG. 2 schematically illustrates a conductive layer 21 of a reflective mask 1 according to one embodiment of the present invention. As shown in FIG. 2, the reflective mask 1 may be held by an electrostatic chuck. Under such a design, the reflective mask 1 may comprise a first conductive layer 21 formed on the first surface 111 and a second conductive layer (not shown) formed on the second surface 112. The first or second conductive layer may be formed from a material such as Chromium, Molybdenum, and Aluminum.

Figure 3:
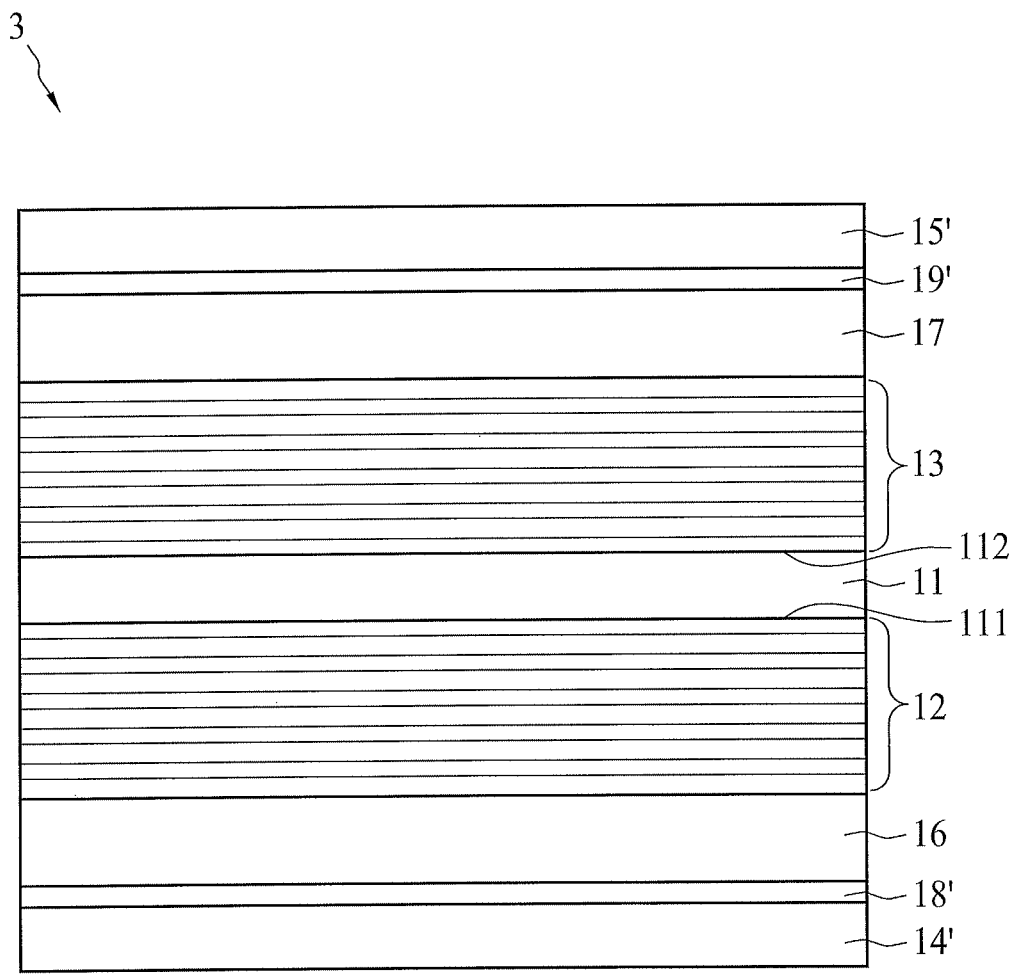
FIG. 3 schematically illustrates a mask blank according to one embodiment of the present invention.

FIG. 3 schematically illustrates a mask blank 3 according to one embodiment of the present invention. As illustrated in FIG. 3, the mask blank 3 may comprise a substrate 11 having a first surface 111 and a second surface 112, first and second reflective multi-layers 12 and 13 respectively formed on the first and second surfaces 111 and 112, first and second capping layers 16 and 17 respectively formed on the first and second reflective multi-layers 12 and 13, and first and second absorber layers 14' and 15' respectively formed on the first and second capping layers 16 and 17. In some embodiments, the mask blank 3 may further comprise a first buffer layer 18' formed between the first capping layer 16 and the first absorber layer 14' and a second buffer layer 19' formed between the second capping layer 17 and the second absorber layer 15'.

A mask fabrication process can be separately applied to the two opposite sides of the mask blank 3. Photoresist is applied to the first or second absorber layer 14' or 15'. A Laser beam or an e-beam writing tool can be applied to pattern the photoresist. A suitable etch process is used to etch the first or second absorber layer 14' or 15'. In some embodiments, after the inspection of the patterned first or second absorber layer 14 or 15 (FIG. 1), a suitable etch process is applied to etch the buffer layer 18' or 19'.

In some embodiments, the mask blank 3 may further comprise first and second conductive layers used for holding the mask by an electrostatic chuck. The first conductive layer is immediately formed on the first surface 111 of the substrate 11, under the first reflective multi-layer 12, and the second conductive layer is immediately formed on the second surface 112 of the substrate 11, under the second reflective multi-layer 13. The first and second conductive layers may be exposed by a suitable etching process.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:
1. A reflective mask comprising:
a substrate comprising a first surface and a second surface opposite to the first surface;
a first reflective multi-layer formed on the first surface;

a second reflective multi-layer formed on the second surface;

a first patterned absorber layer formed on the first reflective multi-layer; and a second patterned absorber layer formed on the second reflective multi-layer.

2. The reflective mask of claim 1, wherein the first patterned absorber layer and the second patterned absorber layer are configured to have a same pattern.

3. The reflective mask of claim 1, wherein the first patterned absorber layer and the second patterned absorber layer are configured to have different patterns.

4. The reflective mask of claim 1, further comprising a first conductive layer formed on the first surface and a second conductive layer formed on the second surface.

5. The reflective mask of claim 1, further comprising a first capping layer formed between the first patterned absorber layer and the first reflective multi-layer, and a second capping layer formed between the second patterned absorber layer and the second reflective multi-layer.

6. The reflective mask of claim 5, further comprising a first buffer layer formed between the first capping layer and the first patterned absorber layer, and a second buffer layer formed between the second capping layer and the second patterned absorber layer.

7. The reflective mask of claim 6, wherein the first or second buffer layer comprises silicon dioxide.

8. The reflective mask of claim 5, wherein the first or second capping layer comprises carbon, silicon carbide, silicon, ruthenium, and silicon nitride.

9. The reflective mask of claim 1, wherein the substrate comprises fused silica, or Ti and Sn-doped fused silica.

10. The reflective mask of claim 1, wherein the first or second reflective multi-layer comprises molybdenum and silicon, or the first or second reflective multi-layer comprises molybdenum and beryllium.

11. The reflective mask of claim 1, wherein the first or second patterned absorber layer comprises metal, alloy or a tantalum-based material.

12. A mask blank comprising:
a substrate comprising a first surface and a second surface opposite to the first surface;
a first reflective multi-layer formed on the first surface;
a second reflective multi-layer formed on the second surface;
a first capping layer formed on the first reflective multi-layer;
a second capping layer formed on the second reflective multi-layer;
a first absorber layer formed on the first capping layer; and
a second absorber layer formed on the second capping layer.

13. The mask blank of claim 12, further comprising a first conductive layer formed on the first surface and a second conductive layer formed on the second surface.

14. The mask blank of claim 12, further comprising a first buffer layer formed between the first capping layer and the first absorber layer, and a second buffer layer formed between the second capping layer and the second absorber layer.

15. The mask blank of claim 14, wherein the first or second buffer layer comprises silicon dioxide.

16. The mask blank of claim 12, wherein the first or second capping layer comprises carbon, silicon carbide, silicon, ruthenium, and silicon nitride.

17. The mask blank of claim 12, wherein the substrate comprises fused silica, or Ti and Sn-doped fused silica.

18. The mask blank of claim 12, wherein the first or second reflective multi-layer comprises molybdenum and silicon, or the first or second reflective multi-layer comprises molybdenum and beryllium.

19. The mask blank of claim 12, wherein the first or second absorber layer comprises metal, alloy or a tantalum-based material.

* * * * *